(12) United States Patent
Yoshimasu et al.

(10) Patent No.: US 11,362,623 B2
(45) Date of Patent: Jun. 14, 2022

(54) VOLTAGE-CONTROLLED OSCILLATOR

(71) Applicant: SAMSUNG ELECTRONICS CO., LTD., Suwon-si (KR)

(72) Inventors: Toshihiko Yoshimasu, Tokyo (JP); Kouki Tanji, Yokohama (JP); Tsuyoshi Sugiura, Yokohama (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/082,159

(22) Filed: Oct. 28, 2020

(65) Prior Publication Data

US 2021/0167727 A1 Jun. 3, 2021

(30) Foreign Application Priority Data

Dec. 3, 2019 (JP) .............................. JP2019-219023
Aug. 12, 2020 (KR) ......................... 10-2020-0101033

(51) Int. Cl.
| | | |
|---|---|---|
| H03B 5/12 | (2006.01) | |
| H04B 1/3827 | (2015.01) | |
| H04B 1/40 | (2015.01) | |
| H04B 1/16 | (2006.01) | |
| H04B 1/04 | (2006.01) | |

(52) U.S. Cl.
CPC ......... *H03B 5/1212* (2013.01); *H04B 1/3827* (2013.01); *H04B 1/40* (2013.01); *H03B 2200/004* (2013.01); *H04B 1/04* (2013.01); *H04B 1/16* (2013.01)

(58) Field of Classification Search
CPC ............ H03B 5/1212; H03B 2200/004; H04B 1/3827; H04B 1/40; H04B 1/04; H04B 1/16
See application file for complete search history.

(56) References Cited

U.S. PATENT DOCUMENTS 7,321,271 B2 * 1/2008 Takinami ................ H03L 7/099
                                                    331/117 R
10,250,188 B2   4/2019 Lin et al.
(Continued)

FOREIGN PATENT DOCUMENTS

| JP | 1994-029739 A | 2/1994 |
|---|---|---|
| JP | 2003-229718 A | 8/2003 |

(Continued)

*Primary Examiner* — Nguyen T Vo
(74) *Attorney, Agent, or Firm* — NSIP Law

(57) ABSTRACT

A voltage-controlled oscillator includes a first transistor, a second transistor, an inductive impedance element, a first variable capacitive impedance element, and a second variable capacitive impedance element. The first transistor has a source coupled to a first power source, a drain coupled to a first node, and a gate coupled to a second node. The second transistor has a source coupled to the first power source, a drain coupled to the second node, and a gate coupled to the first node. The inductive impedance element has a first terminal coupled to the first node and a second terminal coupled to the second node. The first variable capacitive impedance element has a first terminal coupled to the first node and a second terminal coupled to a third node. The second variable capacitive impedance element has a first terminal coupled to the second node and a second terminal coupled to the third node.

19 Claims, 6 Drawing Sheets

(56) References Cited

U.S. PATENT DOCUMENTS

| | | | | |
|---|---|---|---|---|
| 2008/0111642 A1* | 5/2008 | Bohorquez | .......... | H03B 5/1243 |
| | | | | 331/117 FE |
| 2008/0266002 A1* | 10/2008 | Liu | ....... | H03L 7/0893 |
| | | | | 331/25 |
| 2009/0085682 A1* | 4/2009 | Jang | ....... | H03B 19/14 |
| | | | | 331/117 FE |
| 2011/0241788 A1* | 10/2011 | Jang | ....... | H03B 5/124 |
| | | | | 331/117 FE |
| 2012/0001699 A1* | 1/2012 | Yang | ............ | H03B 5/1212 |
| | | | | 331/117 FE |
| 2012/0025921 A1* | 2/2012 | Yang | ............ | H03B 5/1243 |
| | | | | 331/117 FE |
| 2013/0169374 A1* | 7/2013 | Huang | ............ | H03B 5/1296 |
| | | | | 331/117 FE |
| 2014/0368285 A1* | 12/2014 | Lu | ....... | H03B 5/1243 |
| | | | | 331/117 FE |
| 2019/0229676 A1* | 7/2019 | Germann | ............ | H01L 28/88 |
| 2021/0083624 A1* | 3/2021 | Urakawa | ............ | H04B 1/04 |

FOREIGN PATENT DOCUMENTS

| | | |
|---|---|---|
| JP | 2004-056818 | 2/2004 |
| JP | 2005-323016 A | 11/2005 |
| JP | 2005-333308 A | 10/2009 |
| JP | 2010-074501 A | 10/2012 |
| JP | 2010-118967 A | 11/2012 |
| JP | 2012-253561 A | 12/2012 |
| JP | 2013-000001 A | 1/2013 |
| JP | 2015-126280 A | 10/2018 |
| KR | 1998-0028925 U | 8/1998 |

* cited by examiner

VOLTAGE-CONTROLLED OSCILLATOR

CROSS-REFERENCE TO RELATED APPLICATIONS

This application claims the benefit under 35 USC § 119(a) of Japanese Patent Application No. 2019-219023 filed on Dec. 3, 2019, in the Japanese Patent Office, and Korean Patent Application No. 10-2020-0101033 filed on Aug. 12, 2020, in the Korean Intellectual Property Office, the entire disclosures of which are incorporated herein by reference for all purposes.

BACKGROUND

1. Field

The following description relates to an electronic circuit, and more particularly, to a voltage-controlled oscillator.

2. Description of Related Art

A wireless communication network may include a number of base stations capable of supporting communication for a number of mobile stations. The mobile stations may communicate with the base stations through downlink and uplink transmissions. Various wireless communication devices are used for wireless communication. Such wireless communication devices include smartphones, mobile phones, tablet computers, laptop computers, smart vehicles, wearable devices, and the like.

One of the important components for such wireless communication devices is a voltage-controlled oscillator (VCO). The voltage-controlled oscillator is a device for generating a local oscillating signal in a wireless communication device, and may change the frequency of the local oscillating signal by voltage.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a voltage-controlled oscillator includes a first transistor, a second transistor, an inductive impedance element, a first variable capacitive impedance element, and a second variable capacitive impedance element. The first transistor has a source coupled to a first power source, a drain coupled to a first node, and a gate coupled to a second node. The second transistor has a source coupled to the first power source, a drain coupled to the second node, and a gate coupled to the first node. The inductive impedance element has a first terminal coupled to the first node and a second terminal coupled to the second node. The first variable capacitive impedance element has a first terminal coupled to the first node and a second terminal coupled to a third node. The second variable capacitive impedance element has a first terminal coupled to the second node and a second terminal coupled to the third node.

A frequency control voltage may be applied to the third node.

The first variable capacitive impedance element may include a third transistor and a first capacitor coupled between a gate of the third transistor and a drain of the third transistor. The second variable capacitive impedance element may include a fourth transistor and a third capacitor coupled between a gate of the fourth transistor and a drain of the fourth transistor.

The first variable capacitive impedance element may further include a second capacitor coupled between the gate of the third transistor and the first node, and the second variable capacitive impedance element may further include a fourth capacitor coupled between the gate of the fourth transistor and the second node.

The first variable capacitive impedance element may further include a third resistor coupled between the gate of the third transistor and the third node, and the second variable capacitive impedance element may further include a fourth resistor coupled between the gate of the fourth transistor and the third node.

The source of the third transistor and a source of the fourth transistor may be coupled to a second power source.

A common connection terminal of the inductive impedance element may be coupled to a second power source.

The voltage-controlled oscillator may further include a first bias circuit configured to provide a bias current to the drain of the third transistor and a second bias circuit configured to provide a bias current to the drain of the fourth transistor.

The first bias circuit may include a fifth transistor having a gate and a drain coupled together, and a bias voltage applied to a source of the fifth transistor, and a sixth transistor having a gate coupled to the gate of the fifth transistor, a drain coupled to the drain of the third transistor, and the bias voltage applied to the source of the sixth transistor. The second bias circuit may include a seventh transistor having a gate and a drain coupled together and the bias voltage may be applied to a source of the seventh transistor. An eighth transistor may have a gate coupled to the gate of the seventh transistor, a drain coupled to the drain of the fourth transistor, and the bias voltage may be applied to a source of the eighth transistor.

The first bias circuit may further include a first mirror resistor coupled between the drain of the fifth transistor and a second power source, and the second bias circuit may further include a second mirror resistor coupled between the drain of the seventh transistor and the second power source.

The voltage-controlled oscillator may further include a first resistor coupled between the drain of the first transistor and the first node, and a second resistor coupled between the drain of the second transistor and the second node.

The third transistor and the fourth transistor may be metal-oxide-semiconductor (MOS) transistors.

The second capacitor, the first capacitor, the fourth capacitor, and the third capacitor may be formed using interwire capacitance.

In another general aspect, a voltage-controlled oscillator includes cross-coupled transistors, and capacitive impedance elements respectively coupled between the cross-coupled transistors and a frequency control voltage. The capacitive impedance elements each include a transistor, and a capacitor coupled between a gate and a drain of the transistor.

The capacitive impedance elements may each further include an additional capacitor coupled between each of the cross-coupled transistors and the gate of the transistor.

The capacitive impedance elements may each further include a resistor coupled between the gate of the transistor and the frequency control voltage.

The capacitive impedance elements may each further include a bias circuit configured to provide a bias current to the transistor included in each of the capacitive impedance elements.

The bias circuit may be further configured to provide the bias current to the drain of the transistor included in each of the capacitive impedance elements.

A wireless communication device may include at least one antenna and at least one of a receiver configured to receive a radio frequency (RF) signal through the at least one antenna or a transmitter configured to transmit an RF signal through the at least one antenna. At least one of the receiver or the transmitter may include the voltage-controlled oscillator.

An electronic device may include the voltage-controlled oscillator.

Other features and aspects will be apparent from the following detailed description, the drawings, and the claims.

Figure 1:
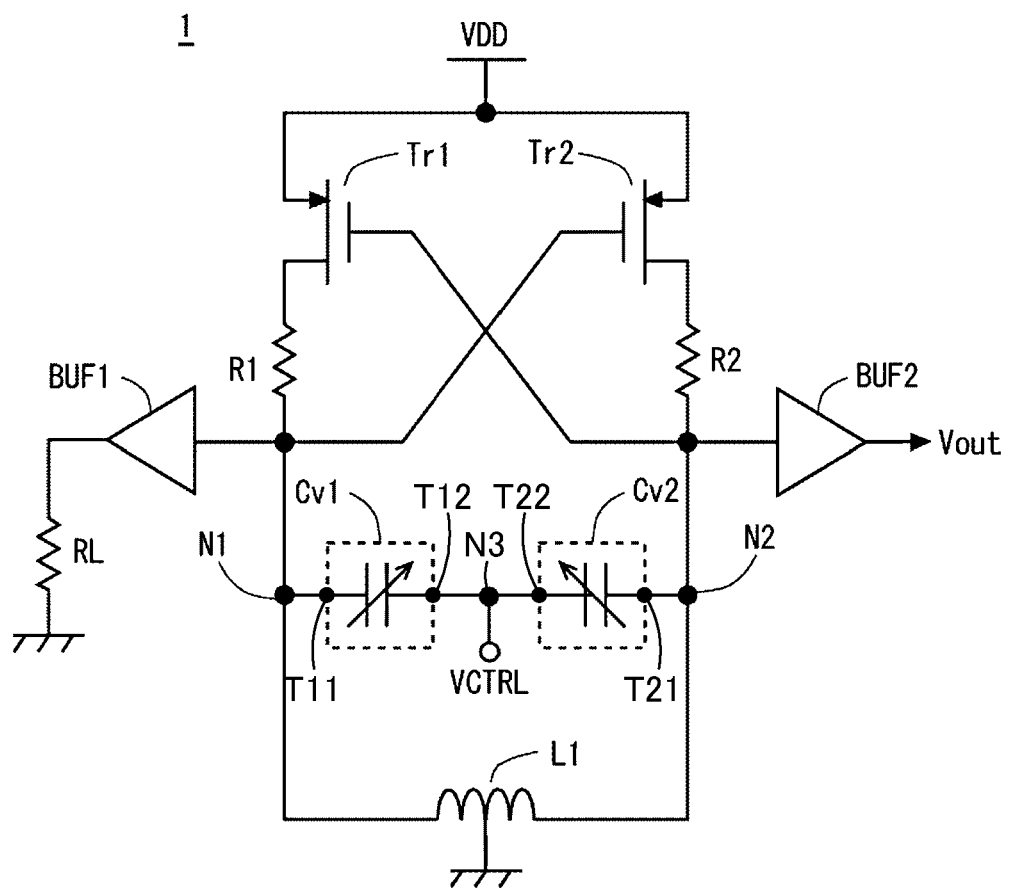
FIG. 1 is a circuit diagram illustrating an example of a voltage-controlled oscillator.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a circuit diagram illustrating an example of a voltage-controlled oscillator. In FIG. 1, for example, a voltage-controlled oscillator 1 includes a first transistor Tr1, a second transistor Tr2, a first variable capacitive impedance element Cv1, a second variable capacitive impedance element Cv2, and an inductive impedance element L1. The first transistor Tr1 and the second transistor Tr2 are cross-coupled. In addition to the elements mentioned above, the voltage-controlled oscillator 1 may further include a first buffer circuit BUF1, a second buffer circuit BUF2, and a load resistor RL. In the voltage-controlled oscillator 1, a power voltage VDD may be provided by a first power source, and a second power source may provide a ground voltage GND. Further, a frequency control voltage VCTRL may be applied to control a frequency of an output signal Vout of the voltage-controlled oscillator 1.

In one example, the source of the first transistor Tr1 is coupled to the first power source. The first power source provides the power voltage VDD. The drain of the first transistor Tr1 is coupled to a first node N1. The gate of the first transistor Tr1 is coupled to a second node N2. The source of the second transistor Tr2 is coupled to the first power source. The first power source provides the power voltage VDD. The drain of the second transistor Tr2 is coupled to the second node N2. The gate of the first transistor Tr1 is coupled to the first node N1. Thus, the drain of the first transistor Tr1 is coupled to the gate of the second transistor Tr2, and the gate of the first transistor Tr1 is coupled to the drain of the second transistor Tr2. The drain of the second transistor Tr2 is coupled to the gate of the first transistor Tr1, and the gate of the second transistor Tr2 is coupled to the drain of the first transistor Tr1.

As shown in FIG. 1, the voltage-controlled oscillator 1 may further include a first resistor R1 coupled between the drain of the first transistor Tr1 and the first node N1 and a second resistor R2 coupled between the drain of the second transistor Tr2 and the second node N2. The drain of the first transistor Tr1 may be coupled to a terminal of the first resistor R1, and the drain of the second transistor Tr2 may be coupled to a terminal of the second resistor R2. Further, the gate of the first transistor Tr1 may be coupled to another terminal of the second resistor R2, and the gate of the second transistor Tr2 may be coupled to another terminal of the first resistor R1. The first resistor R1 and the second resistor R2 may serve as load resistors of the first transistor Tr1 and the second transistor Tr2, respectively. In some examples, it is also possible to employ a circuit configuration that does not use the resistors R1 and R2. Therefore, it is obvious to those skilled in the art and after an understanding of the disclosure of this application that if it is described that the drain of the first transistor Tr1 is coupled to the first node N1, a resistor may or may not be included between the drain of the first transistor Tr1 and the first node N1. Similarly, it is obvious to those skilled in the art and after an understanding of the disclosure of this application that if it is described that the drain of the second transistor Tr2 is coupled to the second node N2, a resistor may or may not be included between the drain of the second transistor Tr2 and the second node N2.

A first terminal of the inductive impedance element L1 may be coupled to the first node N1, and a second terminal of the inductive impedance element L1 may be coupled to the second node N2. For example, a terminal of the inductive impedance element L1 is coupled to the drain of the first transistor Tr1, and another terminal of the inductive impedance element L1 is coupled to the drain of the second transistor Tr2.

In the example employing the resistors R1 and R2, the first terminal of the inductive impedance element L1 is coupled to the drain of the first transistor Tr1 through the first resistor R1. Here, the node N1 that couples the first terminal of the inductive impedance element L1 and the one terminal of the first resistor R1 will be referred to as the first output node N1. The second terminal of the inductive impedance element L1 is coupled to the drain of the second transistor Tr2 through the second resistor R2. Here, the node N2 that couples the second terminal of the inductive impedance element L1 and the one terminal of the second resistor R2 will be referred to as the second output node N2. In some examples, it is also possible to employ a circuit configuration that does not use the resistors R1 and R2. Therefore, it is obvious to those skilled in the art and after an understanding of the disclosure of this application that if it is described that the first terminal of the inductive impedance element L1 is coupled to the drain of the first transistor Tr1, a resistor may or may not be included between the first terminal of the inductive impedance element L1 and the drain of the first transistor Tr1. Similarly, it is obvious to those skilled in the art and after an understanding of the disclosure of this application that if it is described that the second terminal of the inductive impedance element L1 is coupled to the drain of the second transistor Tr2, a resistor may or may not be included between the second terminal of the inductive impedance element L1 and the drain of the second transistor Tr2.

In one example, a first terminal T11 of the first variable capacitive impedance element Cv1 is coupled to the first node N1. A second terminal T12 of the first variable capacitive impedance element Cv1 is coupled to a third node N3. The frequency control voltage VCTRL is applied to the third node N3. For example, the first terminal T11 of the first variable capacitive impedance element Cv1 is coupled to the drain of the first transistor Tr1, and the frequency control voltage VCTRL is applied to the second terminal T12 of the first variable capacitive impedance element Cv1.

In the example of employing the resistor R1, a terminal of the first variable capacitive impedance element Cv1 is coupled to the drain of the first transistor Tr1 through the first resistor R1, and the frequency control voltage VCTRL is applied to another terminal of the first variable capacitive impedance element Cv1. In some examples, it may also be possible to employ a circuit configuration that does not use the resistor R1. Therefore, it is obvious to those skilled in the art and after an understanding of the disclosure of this application that if it is described that the first terminal T11 of the first variable capacitive impedance element Cv1 is coupled to the drain of the first transistor Tr1, a resistor may or may not be included between the first terminal T11 of the first variable capacitive impedance element Cv1 and the drain of the first transistor Tr1.

In one example, a first terminal T21 of the second variable capacitive impedance element Cv2 is coupled to the second node N2. A second terminal T22 of the second variable capacitive impedance element Cv2 is coupled to the third node N3. The frequency control voltage VCTRL is applied to the third node N3. For example, the first terminal T21 of the second variable capacitive impedance element Cv2 is coupled to the drain of the second transistor Tr2, and the frequency control voltage VCTRL is applied to the second terminal T22 of the second variable capacitive impedance element Cv2.

In the example of employing the resistor R2, a terminal of the second variable capacitive impedance element Cv2 is coupled to the drain of the second transistor Tr2 through the second resistor R2, and the frequency control voltage VCTRL is applied to another terminal of the second variable capacitive impedance element Cv2. In some examples, it is also possible to employ a circuit configuration that does not use the resistor R2. Therefore, it is obvious to those skilled in the art and after an understanding of the disclosure of this application that if it is described that the first terminal T21 of the second variable capacitive impedance element Cv2 is coupled to the drain of the second transistor Tr2, a resistor may or may not be included between the first terminal T21 of the second variable capacitive impedance element Cv2 and the drain of the second transistor Tr2.

The voltage-controlled oscillator 1 outputs the output signal Vout through the second buffer circuit BUF2, at the second output node N2 that couples a terminal of the inductive impedance element L1 and a terminal of the second resistor R2. The second buffer circuit BUF2 amplifies a transmission signal generated by the voltage-controlled oscillator 1.

Further, the voltage-controlled oscillator 1 drives the load resistor RL by the first buffer circuit BUF1 coupled to the first output node N1. The first output node N1 is a node that couples a terminal of the inductive impedance element L1 and a terminal of the first resistor R1. The first buffer circuit BUF1 amplifies the transmission signal generated by the voltage-controlled oscillator 1, at the same time equalizing the impedance of the first output node N1 and the impedance of the second output node N2.

Figure 2:
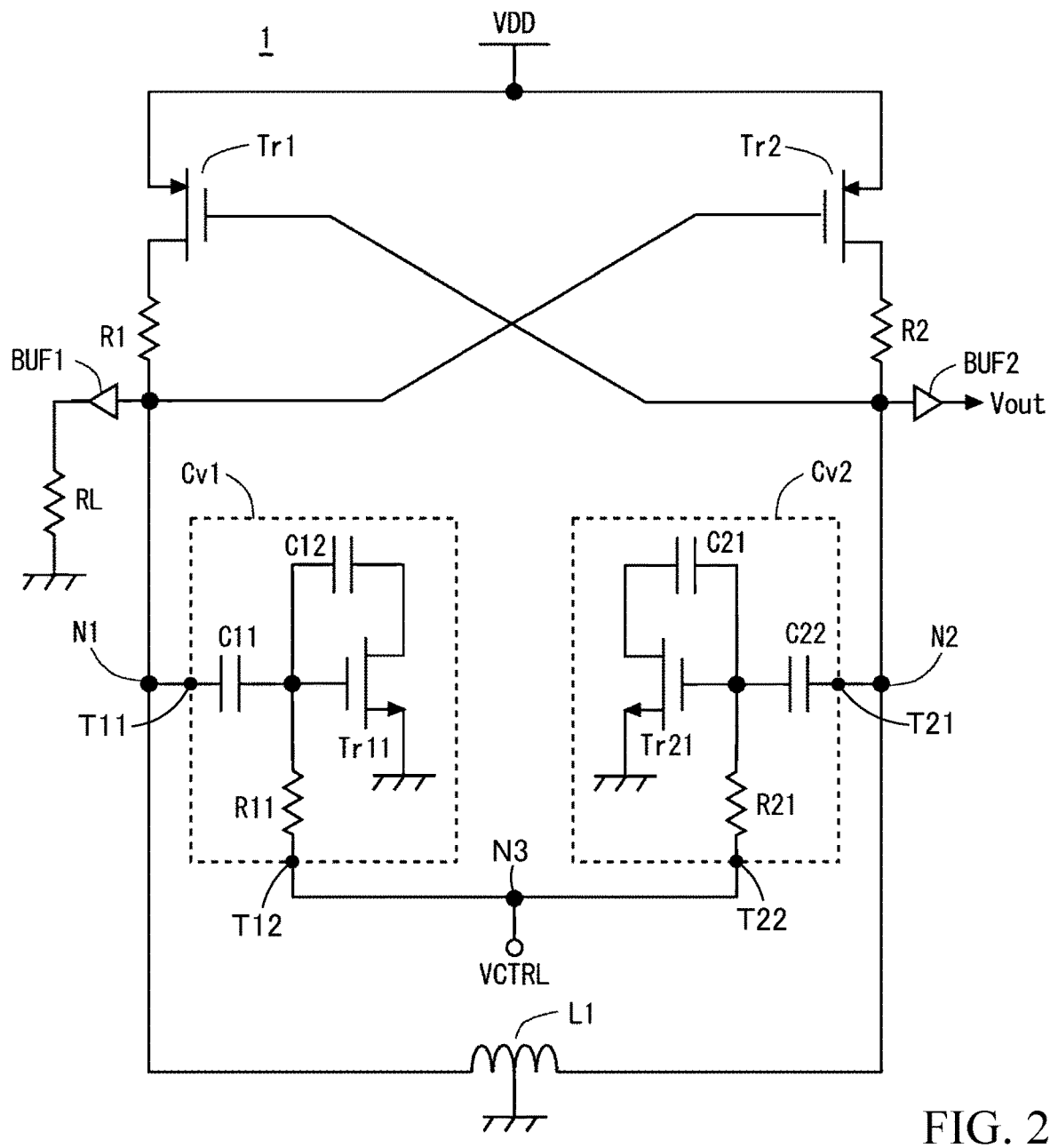
FIG. 2 is a circuit diagram illustrating an example of a voltage-controlled oscillator to describe a detailed circuit diagram of a variable capacitive impedance element.

FIG. 2 is a circuit diagram illustrating an example of a voltage-controlled oscillator, including detailed circuit diagrams of variable capacitive impedance elements. Hereinafter, an example of the configuration of the variable capacitive impedance elements Cv1 and Cv2 will be described in detail.

As shown in FIG. 2, the first variable capacitive impedance element Cv1 and the second variable capacitive impedance element Cv2 may have the same configuration.

The first variable capacitive impedance element Cv1 may include a first capacitor C12, a second capacitor C11, and a third transistor Tr11.

In one example, the first capacitor C12 is coupled between the gate of the third transistor Tr11 and the drain of the third transistor Tr11. For example, a first terminal of the first capacitor C12 is coupled to the gate of the third transistor Tr11, and a second terminal of the first capacitor C12 is coupled to the drain of the third transistor Tr11. The first capacitor C12 may be formed using an interwire capacitance. For example, the first capacitor C12 may be formed with an interlayer capacitance using an interlayer insulating film formed between wiring layers, and metal wires having the interlayer insulating film therebetween.

In one example, the second capacitor C11 is coupled between the gate of the third transistor Tr11 and the first node N1. For example, a first terminal of the second capacitor C11 is coupled to the gate of the third transistor Tr11, and a second terminal of the second capacitor C11 serves as the first terminal T11 of the first variable capacitive impedance element Cv1 and is coupled to the first node N1. The second capacitor C11 may be formed using an interwire capacitance. For example, the second capacitor C11 may be formed with an interlayer capacitance using an interlayer insulating film formed between wiring layers, and metal wires having the interlayer insulating film therebetween.

In one example, the source of the third transistor Tr11 is coupled to the second power source. The second power source may provide the ground voltage. The drain of the third transistor Tr11 is coupled to the gate of the third transistor Tr11 through the first capacitor C12. For example, the gate of the third transistor Tr11 is coupled to the first terminal of the first capacitor C12, and the drain of the third transistor Tr11 is coupled to the second terminal of the first capacitor C12. The gate of the third transistor Tr11 is also coupled to the second capacitor C11. The third transistor Tr11 may be a metal-oxide-semiconductor (MOS) transistor. For ease of description, the third transistor Tr11 may also be referred to as the first capacitive transistor Tr11. The first capacitive transistor Tr11 has a parasitic capacitance.

The first variable capacitive impedance element Cv1 may further include a third resistor R11 coupled between the gate of the third transistor Tr11 and the third node N3. For example, a first terminal of the third resistor R11 is coupled to the gate of the third transistor Tr11, and a second terminal of the third resistor R11 serves as the second terminal T12 of the first variable capacitive impedance element Cv1 and is coupled to the frequency control voltage VCTRL. In some examples, it is also possible to employ a circuit configuration that does not use the third resistor R11.

The second variable capacitive impedance element Cv2 may include the third capacitor C21, the fourth capacitor C22, and the fourth transistor Tr21.

In one example, the third capacitor C21 is coupled between the gate of the fourth transistor Tr21 and the drain of the fourth transistor Tr21. For example, a first terminal of the third capacitor C21 is coupled to the gate of the fourth transistor Tr21, and a second terminal of the third capacitor C21 is coupled to the drain of the fourth transistor Tr21. The third capacitor C21 may be formed using an interwire capacitance. For example, the third capacitor C21 may be formed with an interlayer capacitance using an interlayer insulating film formed between wiring layers, and metal wires having the interlayer insulating film therebetween.

In one example, the fourth capacitor C22 is coupled between the gate of the fourth transistor Tr21 and the second node N2. For example, a first terminal of the fourth capacitor C22 is coupled to the gate of the fourth transistor Tr21, and a second terminal of the fourth capacitor C22 serves as the first terminal T21 of the second variable capacitive impedance element Cv2 and is coupled to the second node N2. The fourth capacitor C22 may be formed using an interwire capacitance. For example, the fourth capacitor C22 may be formed with an interlayer capacitance using an interlayer insulating film formed between wiring layers, and metal wires having the interlayer insulating film therebetween.

In one example, the source of the fourth transistor Tr21 is coupled to the second power source. The second power source may provide the ground voltage. The drain of the fourth transistor Tr21 is coupled to the gate of the fourth transistor Tr21 through the third capacitor C21. For example, the gate of the fourth transistor Tr21 is coupled to the first terminal of the third capacitor C21, and the drain of the fourth transistor Tr21 is coupled to the second terminal of the third capacitor C21. The gate of the fourth transistor Tr21 is also coupled to the fourth capacitor C22. The fourth transistor Tr21 may be a MOS transistor. For ease of description, the fourth transistor Tr21 may also be referred to as the second capacitive transistor Tr21. The second capacitive transistor Tr21 has a parasitic capacitance.

The second variable capacitive impedance element Cv2 may further include a fourth resistor R21 coupled between the gate of the fourth transistor Tr21 and the third node N3. For example, a first terminal of the fourth resistor R21 is coupled to the gate of the fourth transistor Tr21, and a second terminal of the fourth resistor R21 serves as the second terminal T22 of the second variable capacitive impedance element Cv2 and is coupled to the frequency control voltage VCTRL. In some examples, it is also possible to employ a circuit configuration that does not use the fourth resistor R21.

In one example, the capacitance determined by the capacitive transistors Tr11 and Tr21 included in the variable capacitive impedance elements Cv1 and Cv2 and by the capacitors C12 and C21 coupled between the drains and the gates of the capacitive transistors Tr11 and Tr21 is variable.

In one example, the variable capacitance range is determined based on a value obtained by adding the parasitic capacitances of the capacitive transistors Tr11 and Tr21 to the capacitances of the capacitors C12 and C21 coupled between the gates and the drains of the capacitive transistors Tr11 and Tr21. Accordingly, the voltage-controlled oscillator has an expanded variable output frequency range for a variable amount of the frequency control voltage VCTRL.

Hereinafter, the capacitance of the variable capacitive impedance element Cv1 will be described using an example of an equivalent circuit of the capacitive transistor Tr12 and the capacitor C12 of the variable capacitive impedance element Cv1.

Figure 3:
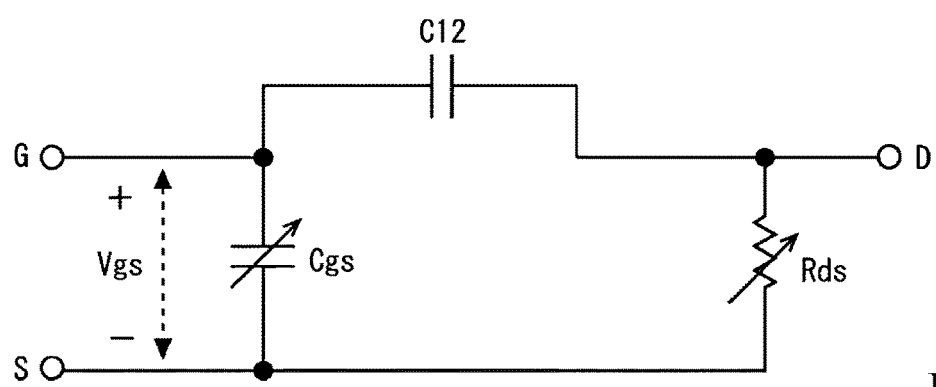
FIG. 3 is an equivalent circuit diagram illustrating an example of a variable capacitive impedance element.

FIG. 3 is an equivalent circuit diagram illustrating an example of a variable capacitive impedance element. In the equivalent circuit diagram of FIG. 3, the gate of the capacitive transistor Tr11 is denoted as a terminal G, the drain of the capacitive transistor Tr11 is denoted as a terminal D, and the source of the capacitive transistor Tr11 is denoted as a terminal S. In the equivalent circuit of the variable capacitive impedance element Cv1, a gate-source capacitance Cgs, which changes by the frequency control voltage VCTRL, is provided between the terminal G and the terminal S. In addition, a source-drain resistance Rds, which varies by the frequency control voltage VCTRL, is provided between the terminal S and the terminal D. Further, the capacitor C12 is coupled between the terminal G and the terminal D.

Calculating the admittance Y of the variable capacitive impedance element Cv1 using the equivalent circuit diagram of FIG. 3, the admittance Y may be expressed by Equation 1. Here, in the following equations, it is considered that the capacitor C12 has a capacitance of about 500 femtofarads (fF).

[Equation 1]

$$Y = \frac{1}{R_{ds} + \frac{1}{j\omega C_{12}}} + j\omega C_{12} = \frac{\omega^2 C_{12}^2 R_{ds}^2}{1 + \omega^2 C_{12}^2 R_{ds}^2} + j\omega \left(C_{gs} + \frac{C_{12}}{1 + \omega^2 C_{12}^2 R_{ds}^2}\right) \quad (1)$$

In Equation 1, if the frequency control voltage VCTRL is 0 volts (V), the source-drain resistance $R_{ds}$ sufficiently increases, and $1 \ll \omega^2 C_{12}^2 R_{ds}^2$ is satisfied. Thus, the admittance Y may be expressed by Equation 2. In Equation 2, $C_{gs0}$ denotes the gate-source capacitance when the frequency control voltage VCTRL is 0 V.

[Equation 2]

$$Y = 1 + j\omega\left(C_{gs0} + \frac{C_{12}}{1 + \omega^2 C_{12}^2 R_{ds}^2}\right) = 1 + j\omega\left(C_{gs0} + \frac{1}{1 + \omega^2 C_{12}^2 R_{ds}^2}\right) = 1 + j\omega C_{gs0} \quad (2)$$

Therefore, if the frequency control voltage VCTRL is 0 V, the influence of the capacitor C12 is not seen, and the admittance Y of the variable capacitive impedance element Cv1 is the same as that in the case where the capacitor C12 is absent.

Meanwhile, if the frequency control voltage VCTRL is 1 V, the source-drain resistance $R_{ds}$ becomes zero, and $1 \ll \omega^2 C_{12}^2 R_{ds}^2$ is satisfied. Thus, the admittance Y may be expressed by Equation 3. In Equation 3, $C_{gs1}$ denotes the gate-source capacitance when the frequency control voltage VCTRL is 1 V.

[Equation 3]

$$Y = j\omega(C_{gs1} + C_{12}) \quad (3)$$

Therefore, the capacitance of the capacitor C12 is added to the capacitance of the variable capacitive impedance element Cv1 as a parallel component, such that the capacitance of the variable capacitive impedance element Cv1 increases by the capacitance of the capacitor C12.

In one example, the variable capacitive impedance element has a capacitance equal to that of a circuit without the capacitor C12 if the frequency control voltage VCTRL is 0 V, and has a capacitance that is obtained by adding the capacitance of the capacitor C12 to the gate-source capacitance $C_{gs}$ if the frequency control voltage VCTRL is 1 V. Accordingly, the variable capacitive impedance element has a more comprehensive variable capacitance range compared to the circuit without the capacitor C12. Further, the voltage-controlled oscillator 1 having the variable capacitive impedance elements Cv1 and Cv2 has an expanded variable oscillation frequency range.

Hereinafter, the characteristics of the variable capacitive impedance elements Cv1 and Cv2 and the characteristics of the voltage-controlled oscillator 1 having the variable capacitive impedance elements Cv1 and Cv2 will be described. In the following description, reference will be made to a voltage-controlled oscillator (Example 1) without a capacitor between the gate and drain of a capacitive transistor of a variable capacitive impedance element, and a voltage-controlled oscillator (Example 2) including a capacitor between the gate and the drain of a capacitive transistor of a variable capacitive impedance element.

Figure 4A:
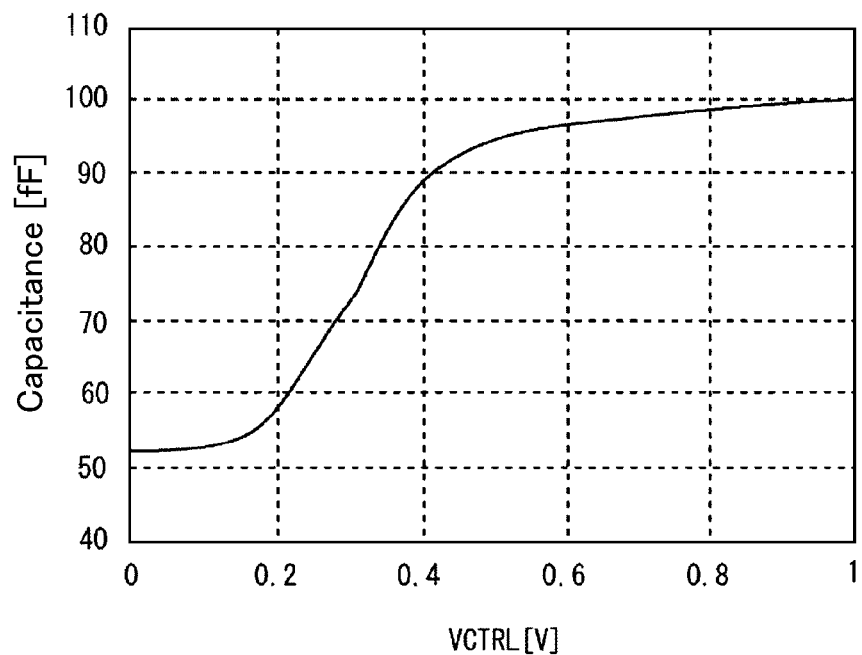
FIGS. 4A and 4B are graphs illustrating examples of a variable capacitance range of a variable capacitive impedance element.

FIG. 4A is a graph describing a variable capacitance range of a variable capacitive impedance element in the voltage-controlled oscillator (Example 1) without a capacitor between the gate and the drain of a capacitive transistor of the variable capacitive impedance element. FIG. 4A illustrates the capacitance of the variable capacitive impedance element according to the change in the frequency control voltage VCTRL, in the voltage-controlled oscillator (Example 1) without a capacitor between the gate and the drain of the capacitive transistor of the variable capacitive impedance element. As shown in FIG. 4A, if the frequency control voltage VCTRL is changed from 0 V to 1 V, the capacitance of the variable capacitive impedance element varies from about 50 fF to about 100 fF. Here, it may be learned that the variable capacitance range of the variable capacitive impedance element is from about 50 fF to about 100 fF.

Figure 4B:
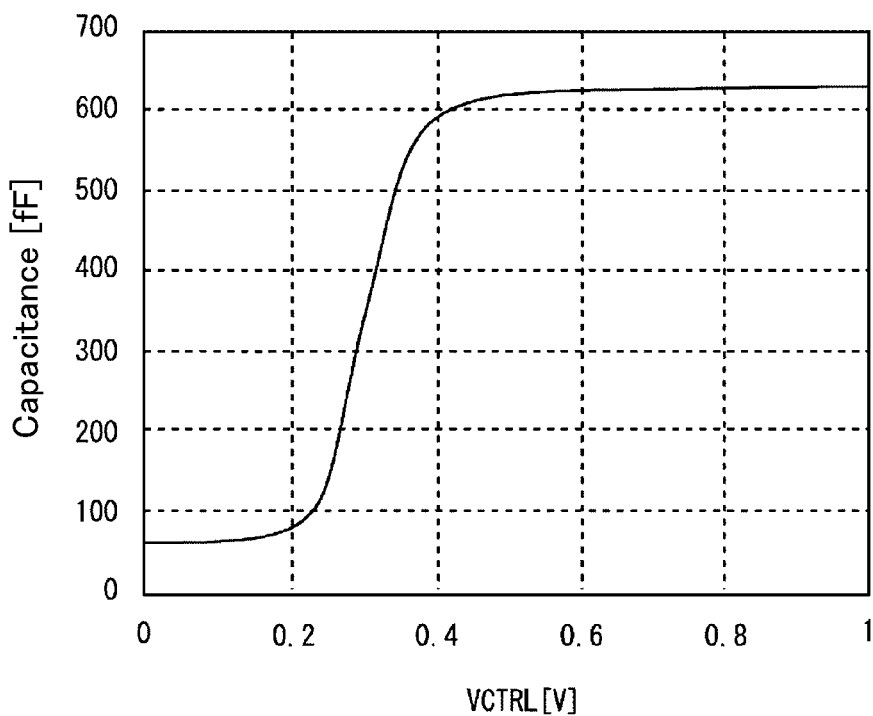

FIG. 4B is a graph describing a variable capacitance range of a variable capacitive impedance element in the voltage-controlled oscillator (Example 2), including a capacitor between the gate and the drain of a capacitive transistor of the variable capacitive impedance element. FIG. 4B illustrates the capacitance of the variable capacitive impedance element according to the change in the frequency control voltage VCTRL, in the voltage-controlled oscillator (Example 2), including the capacitor between the gate and the drain of the capacitive transistor of the variable capacitive impedance element. As shown in FIG. 4B, if the frequency control voltage VCTRL is changed from 0 V to 1 V, the capacitance of the variable capacitive impedance element varies from about 50 fF to 600 fF or more. Here, it may be learned that the variable capacitance range of the variable capacitive impedance element is from about 50 fF to 600 fF or more.

The variable capacitive impedance element in the voltage-controlled oscillator (Example 2), including the capacitor between the gate and drain of the capacitive transistor, has a wider variable capacitance range than the variable capacitive impedance element in the voltage-controlled oscillator (Example 1) without a capacitor coupled between the gate and the drain of the capacitive transistor.

Figure 5A:
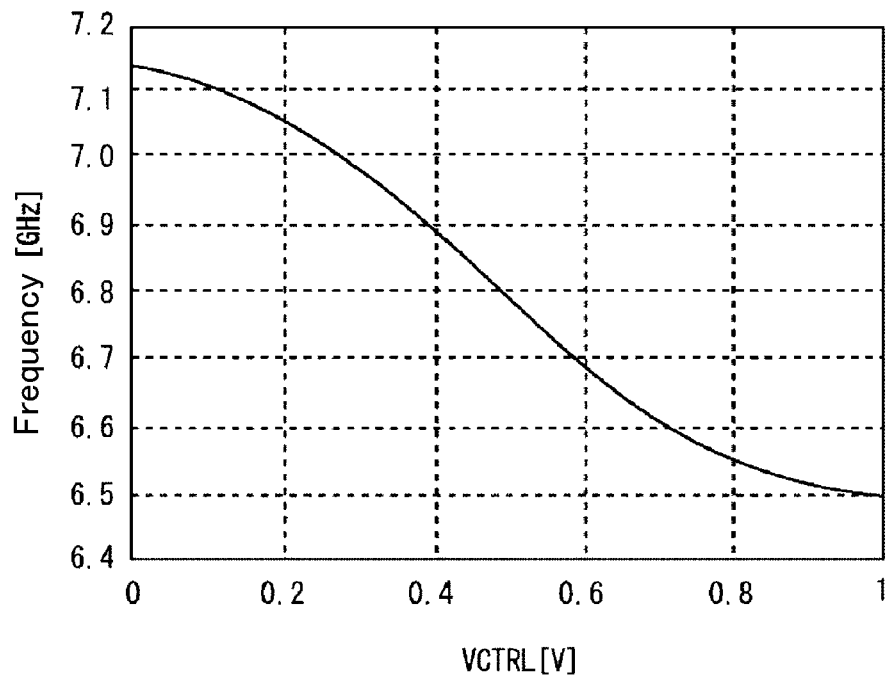
FIGS. 5A and 5B are graphs illustrating examples of a variable frequency range of a voltage-controlled oscillator.

FIG. 5A is a graph describing a variable frequency range of the voltage-controlled oscillator (Example 1) without a capacitor between the gate and the drain of a capacitive transistor of the variable capacitive impedance element. FIG. 5A illustrates the oscillation frequency of the voltage-controlled oscillator according to the change in the frequency control voltage VCTRL, in the voltage-controlled oscillator (Example 1) without a capacitor between the gate and the drain of the capacitive transistor of the variable capacitive impedance element. As shown in FIG. 5A, if the frequency control voltage VCTRL is changed from 0 V to 1 V, the oscillation frequency of the voltage-controlled oscillator varies from about 7.1 GHz to about 6.5 GHz. Here, it may be learned that the variable frequency range of the voltage-controlled oscillator of Example 1 is from about 7.1 GHz to about 6.5 GHz.

Figure 5B:
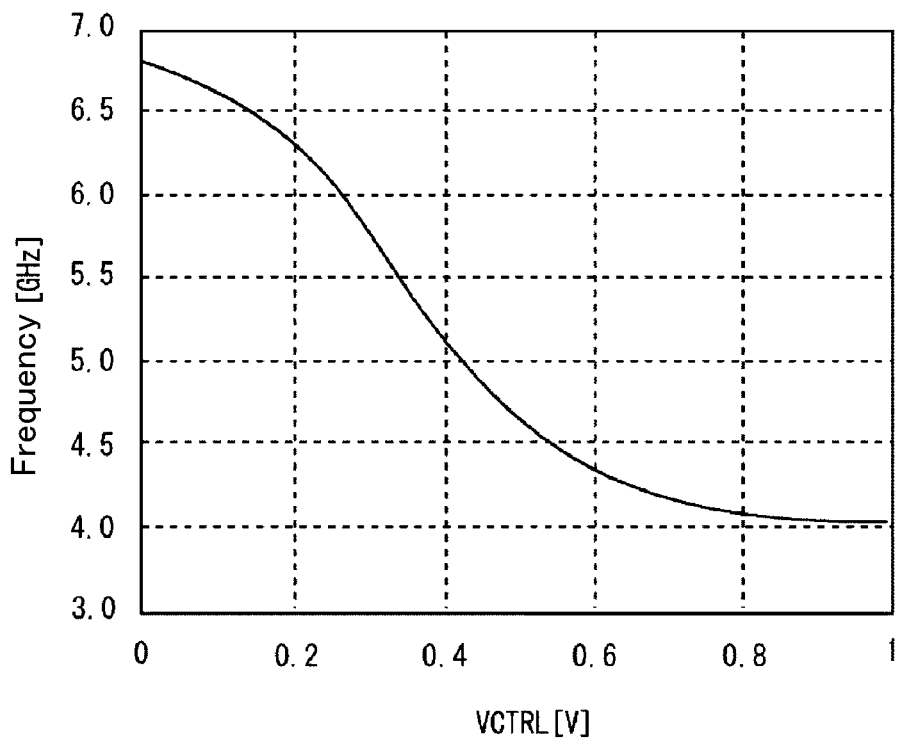

FIG. 5B is a graph describing a variable frequency range of the voltage-controlled oscillator (Example 2), including a capacitor between the gate and the drain of a capacitive transistor of the variable capacitive impedance element. FIG. 5B illustrates the oscillation frequency of the voltage-controlled oscillator according to the change in the frequency control voltage VCTRL, in the voltage-controlled oscillator (Example 2), including a capacitor between the gate and the drain of the capacitive transistor of the variable capacitive impedance element. As shown in FIG. 5B, if the frequency control voltage VCTRL is changed from 0 V to 1 V, the oscillation frequency of the voltage-controlled oscillator varies from about 6.7 GHz to about 4.0 GHz. Here, it may be learned that the variable frequency range of the voltage-controlled oscillator of Example 2 is from about 6.7 GHz to about 4.0 GHz.

The voltage-controlled oscillator (Example 2), including the capacitor between the gate and drain of the capacitive transistor, has a wider variable frequency range than the voltage-controlled oscillator (Example 1) without a capacitor coupled between the gate and the drain of the capacitive transistor. As such, when a capacitor provided between the gate and drain of the capacitive transistor is included in the variable capacitive impedance element of the voltage-controlled oscillator, the variable oscillation frequency range of the voltage-controlled oscillator is expanded.

Accordingly, the voltage-controlled oscillator 1 may expand the variable capacitance range of the variable capacitive impedance element by providing a capacitor between the gate and the drain of the capacitive transistor of the variable capacitive impedance element. In addition, the voltage-controlled oscillator 1 having such a variable capacitive impedance element may expand the variable frequency range of an output signal by a larger width than the voltage-controlled oscillator having a variable capacitive impedance element without a capacitor between the gate and the drain of the capacitive transistor.

Hereinafter, variable capacitive impedance elements Cv1a and Cv2a, which are different types of the variable capacitive impedance elements Cv1 and Cv2 of the voltage-controlled oscillator of FIG. 2, will be described with reference to FIG. 6. Here, the same reference numerals as in FIG. 2 may be assigned to components that are the same as the components shown in FIG. 2. The variable capacitive impedance elements Cv1a and Cv2a of FIG. 6 correspond to the variable capacitive impedance elements Cv1 and Cv2 of FIG. 2 to which a bias circuit including two transistors and a single resistor is added. The bias circuit provides a bias current to the drains of the capacitive transistors Tr11 and Tr21.

Figure 6:
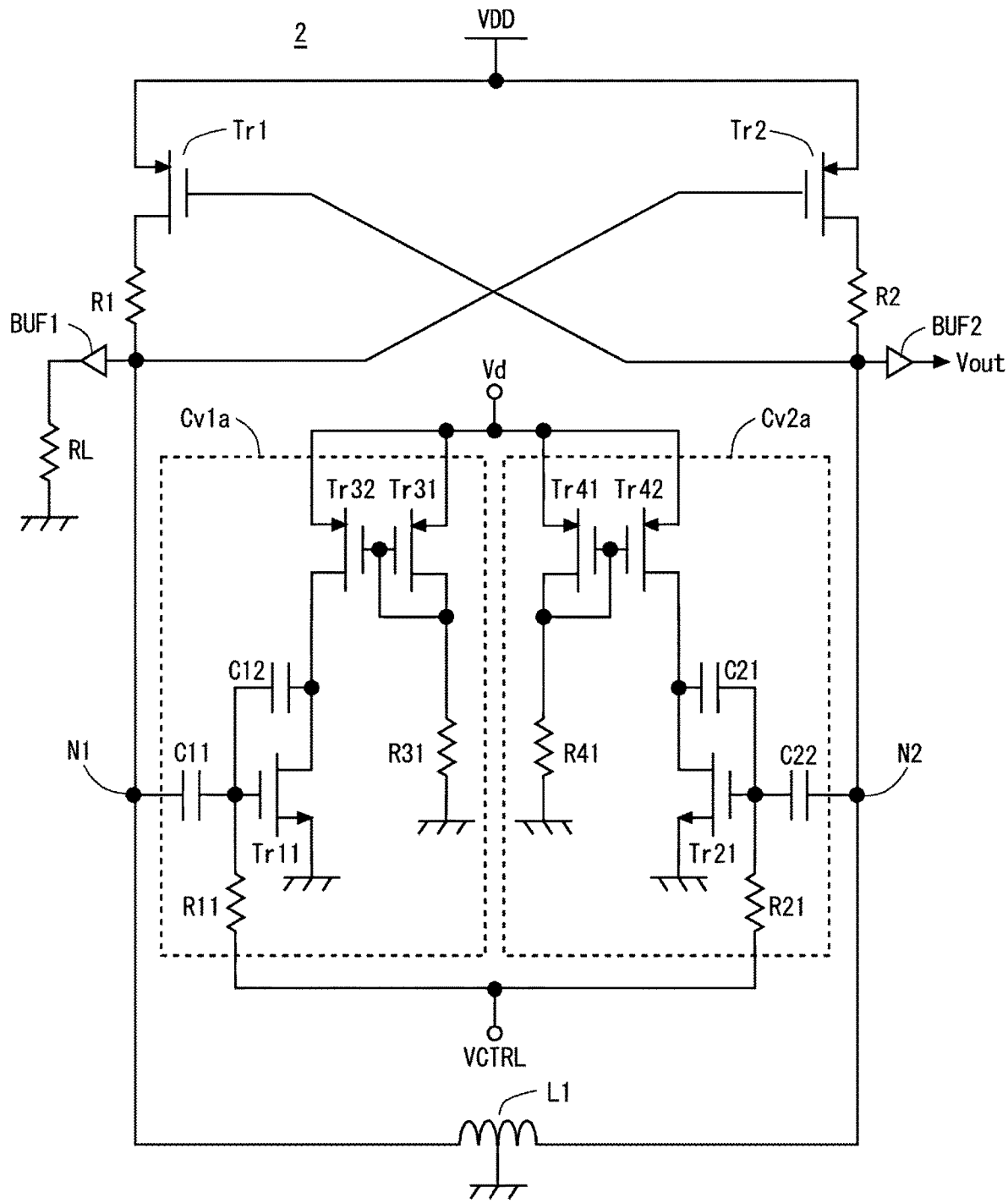
FIG. 6 is a circuit diagram illustrating an example of a voltage-controlled oscillator to describe a detailed circuit diagram of a variable capacitive impedance element.

FIG. 6 is a circuit diagram illustrating an example of a voltage-controlled oscillator, including detailed circuit diagrams of variable capacitive impedance elements.

In one example, a voltage-controlled oscillator 2 includes a first transistor Tr1, a second transistor Tr2, a first variable capacitive impedance element Cv1a, a second variable capacitive impedance element Cv2a, and an inductive impedance element L1. In addition to the elements mentioned above, the voltage-controlled oscillator 2 may further include a first buffer circuit BUF1, a second buffer circuit BUF2, and a load resistor RL. The first transistor Tr1 and the second transistor Tr2 are cross-coupled. The source of the first transistor Tr1 is coupled to a first power source VDD. The source of the second transistor Tr2 is coupled to the first power supply VDD, the drain of the second transistor Tr2 is coupled to the gate of the first transistor Tr1, and the gate of the second transistor Tr2 is coupled to the drain of the first transistor Tr1. A terminal of the inductive impedance element L1 is coupled to the drain of the first transistor Tr1, and another terminal of the inductive impedance element L1 is coupled to the drain of the second transistor Tr2.

In one example, a first terminal of the first variable capacitive impedance element Cv1a is coupled to the drain of the first transistor Tr1, and a frequency control voltage VCTRL is applied to a second terminal of the first variable capacitive impedance element Cv1a. A first terminal of the second variable capacitive impedance element Cv2a is coupled to the drain of the second transistor Tr2, and the frequency control voltage VCTRL is applied to a second terminal of the second variable capacitive impedance element Cv2a.

The first variable capacitive impedance element Cv1a may include a first capacitor C12, a second capacitor C11, a third transistor Tr11, a third resistor R11, and a first bias circuit. The first capacitor C12 is coupled between the gate of the third transistor Tr11 and the drain of the third transistor Tr11. The second variable capacitive impedance element Cv2a may include a third capacitor C21, a fourth capacitor C22, a fourth transistor Tr21, a fourth resistor R21, and a second bias circuit. The third capacitor C21 is coupled between the gate of the fourth transistor Tr21 and the drain of the fourth transistor Tr21. The first capacitor C12 and the third capacitor C21 may be formed using an interwire capacitance. For example, the first capacitor C12 and the third capacitor C21 may be formed with an interlayer capacitance using an interlayer insulating film formed between wiring layers, and metal wires having the interlayer insulating film therebetween.

In one example, the first bias circuit provides a bias current to the drain of the third transistor Tr11. The first bias circuit includes two transistors and a resistor. As shown in FIG. 6, the first bias circuit includes a fifth transistor Tr31, a sixth transistor Tr32, and a resistor R31. Hereinafter, for ease of description, the fifth transistor Tr31, the sixth transistor Tr32, and the resistor R31 may also be referred to as the first mirror transistor Tr31, the second mirror transistor Tr32, and the first mirror resistor R31, respectively.

In one example, a bias voltage Vd is applied to the source of the first mirror transistor Tr31. The gate of the first mirror transistor Tr31 is coupled to the drain of the first mirror transistor Tr31.

In one example, the bias voltage Vd is applied to the source of the second mirror transistor Tr32. The gate of the second mirror transistor Tr32 is coupled to the gate of the first mirror transistor Tr31. The drain of the second mirror transistor Tr32 is coupled to the drain of the third transistor Tr11.

In one example, the first mirror resistor R31 is coupled between the drain of the first mirror transistor Tr31 and a second power source. For example, a terminal of the first mirror resistor R31 is coupled to the drain of the first mirror transistor Tr31. The terminal of the first mirror resistor R31 is also coupled to the gate of the first mirror transistor Tr31 and to the gate of the second mirror transistor Tr32. Another terminal of the first mirror resistor R31 is coupled to the second power source. The second power source is the ground (GND) and provides a ground voltage.

In one example, the second variable capacitive impedance element Cv2a has substantially the same configuration as the first variable capacitive impedance element Cv1a. For example, the second variable capacitive impedance element Cv2a corresponds to the variable capacitive impedance element Cv2 of FIG. 2 to which the second bias circuit, including a transistor Tr41, a transistor Tr42, and a mirror resistor R41, is added.

In one example, the second bias circuit provides a bias current to the drain of the fourth transistor Tr21. The second bias circuit includes two transistors and a resistor. As shown in FIG. 6, the second bias circuit includes a seventh transistor Tr41, an eighth transistor Tr42, and a resistor R41. Hereinafter, for ease of description, the seventh transistor Tr41, the eighth transistor Tr42, and the resistor R41 may also be referred to as the third mirror transistor Tr41, the fourth mirror transistor Tr42, and the second mirror resistor R41, respectively.

In one example, the bias voltage Vd is applied to the source of the third mirror transistor Tr41. The gate of the third mirror transistor Tr41 is coupled to the drain of the third mirror transistor Tr41.

In one example, the bias voltage Vd is applied to the source of the fourth mirror transistor Tr42. The gate of the fourth mirror transistor Tr42 is coupled to the gate of the third mirror transistor Tr41. The drain of the fourth mirror transistor Tr42 is coupled to the drain of the fourth transistor Tr21.

In one example, the second mirror resistor R41 is coupled between the drain of the third mirror transistor Tr41 and the second power source. For example, a terminal of the third mirror resistor R41 is coupled to the drain of the third mirror transistor Tr41. The terminal of the second mirror resistor R41 is also coupled to the gate of the third mirror transistor Tr41 and to the gate of the fourth mirror transistor Tr42. Another terminal of the second mirror resistor R41 is coupled to the second power source. The second power source is the ground (GND) and provides a ground voltage.

In the variable capacitive impedance elements Cv1a and Cv2a of the voltage-controlled oscillator of FIG. 6, it is possible to achieve a circuit with little change in the value of current flowing in the capacitive transistors Tr11 and Tr21 in response to a change in the value of the bias voltage Vd by appropriately setting the resistances of the mirror resistors R31 and R41.

The voltage-controlled oscillator described above may be included in various types of electronic devices. For example, the electronic devices may include a personal computer (PC), a laptop computer, a tablet computer, a smartphone, a television (TV), a smart electronic device, a smart vehicle, a kiosk, a wearable device, a communication device, a consumer electronic device, an electronic medical device, an industrial electronic device, and the like.

Figure 7:
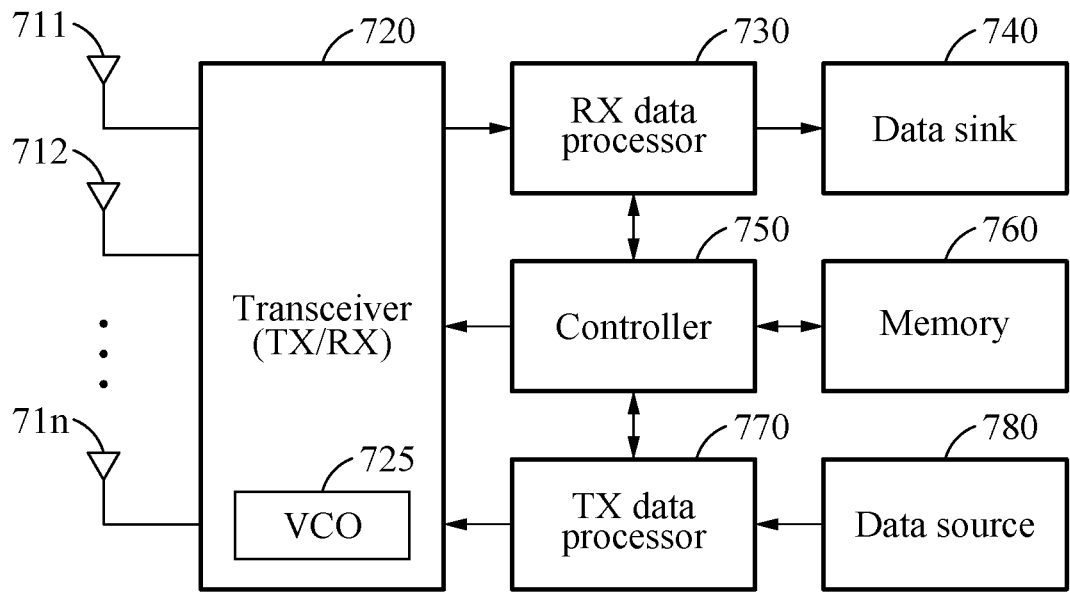
FIG. 7 is a block diagram illustrating an example of a user wireless communication device such as a mobile phone or a smartphone.
Figure 8:
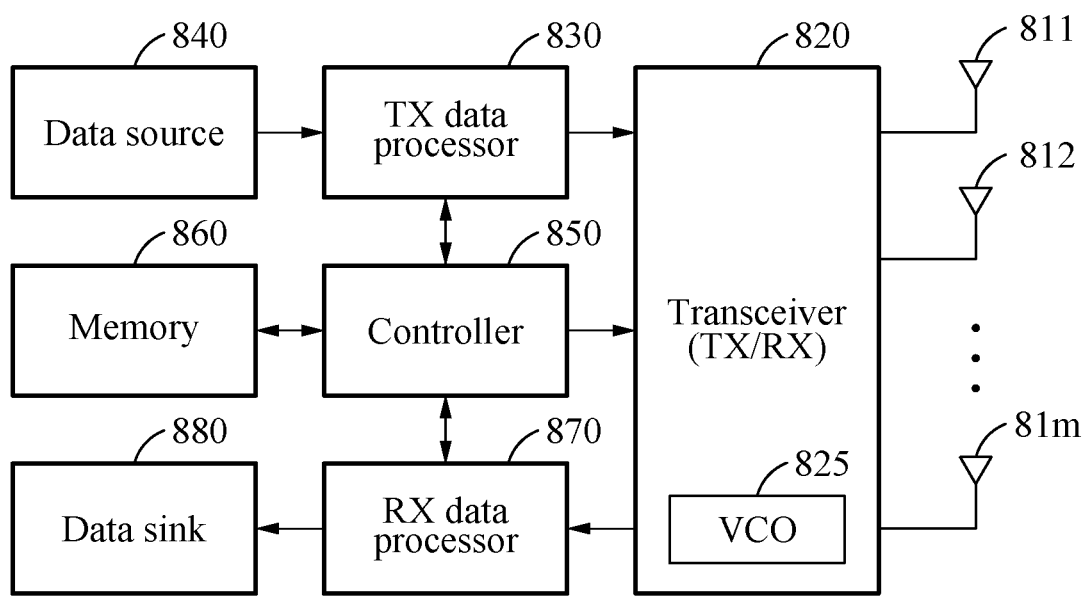
FIG. 8 is a diagram illustrating an example of an access point.

FIG. 7 illustrates an example of a user wireless communication device such as a mobile phone or a smartphone, and FIG. 8 illustrates an example of a wireless communication device such as an access point. A signal transmitted by a user device may be received by an access point, and a signal transmitted by the access point may be received by the user device.

FIG. 7 is a block diagram illustrating an example of a user wireless communication device such as a mobile phone or a smartphone.

In one example, a user terminal 700 includes a plurality of antennas 711, 712, . . . 71n, and a transceiver 720. The transceiver 720 operates as a transmitter or a receiver. In this example, the transmitter and the receiver are implemented by being integrated into the transceiver 720. However, in some examples, the transmitter and the receiver may be implemented independently. Hereinafter, for ease of description, the transceiver 720 may be referred to as a transmitter or a receiver according to its operation. In this case, the transmitter and the receiver may be implemented as a transceiver or may be implemented independently. Further, the user terminal 700 may include both the transmitter and the receiver (including the implementation of the transceiver) or may include only one of the transmitter and the receiver.

An example in which the user terminal 700 receives signals will be described. In the user terminal 700, the plurality of antennas 711, 712, . . . 71n receive downlink signals. The downlink signals may be radio frequency (RF) signals. For processing, the receiver 720 may select signals received from one of the antennas 711, 712, . . . 71n. In some examples, signals from two or more selected from among the antennas 711, 712, . . . 71n may be combined. The receiver 720 generates a recovered downlink data symbol stream by performing processing corresponding to an operation performed by a transmitter of the access point. The receiver 720 provides the recovered downlink data symbol stream to an RX data processor 730. The RX data processor 730 processes (for example, demodulates, deinterleaves, or decodes) the recovered downlink data symbol stream to acquire decoded data for the user terminal 700. For data storage, the decoded data may be sent to a data sink 740. The RX data processor 730 may receive control data from a controller 750.

An example in which the user terminal 700 transmits signals will be described. In the user terminal 700, a TX data processor 770 receives traffic data from a data source 780. The TX data processor 770 may receive control data from the controller 750. The TX data processor 770 processes (for example, encodes, interleaves, or modulates) the traffic data to generate an uplink data symbol stream. The TX data processor 770 provides the uplink data symbol stream to the transmitter 720. The transmitter 720 performs processing (for example, digital-to-analog conversion, amplification, filtering, or frequency up-conversion) of the uplink data symbol stream to generate uplink signals. The transmitter 720 provides the uplink signals to one or two or more of the plurality of antennas 711, 712, . . . 71n through an RF switch (not shown). The controller 750 may control the antenna selection. The antennas 711, 712, . . . 71n transmit the RF signals.

In one example, the receiver 720, the transmitter 720, or the transceiver 720 includes a voltage-controlled oscillator (VCO) 725. The voltage-controlled oscillator is an electronic oscillator, the oscillation frequency of which is controlled by an input control voltage. Therefore, the oscillation frequency of the voltage-controlled oscillator is determined by the input control voltage. The voltage-controlled oscillator 725 may be used to perform frequency modulation or phase modulation by applying a modulation signal to a control signal.

FIG. 8 is a block diagram illustrating an example of an access point.

In one example, an access point 800 includes a plurality of antennas 811, 812, . . . 81n, and a transceiver 820. The transceiver 820 operates as a transmitter or a receiver. In this example, the transmitter and the receiver are implemented by being integrated into the transceiver. However, in some examples, the transmitter and the receiver may be implemented independently. Hereinafter, for ease of description, the transceiver 820 may be referred to as a transmitter or a receiver according to its operation. In this case, the transmitter and the receiver may be implemented as a transceiver or may be implemented independently. Further, the access point 800 may include both the transmitter and the receiver (including the implementation of the transceiver) or may include only one of the transmitter and the receiver.

An example in which the access point 800 transmits signals will be described. The access point 800 may transmit signals to the user terminal 700. In the access point 800, a TX data processor 870 receives traffic data from a data source 880. The TX data processor 870 may receive control data from a controller 850. The TX data processor 870 processes (for example, encodes, interleaves, or modulates) the traffic data to generate a downlink data symbol stream. The TX data processor 870 provides the downlink data symbol stream to the transmitter 820. The transmitter 720 performs processing (for example, digital-to-analog conversion, amplification, filtering, or frequency up-conversion) of the downlink data symbol stream to generate downlink signals. The transmitter 820 provides the downlink signals to one or two or more of the plurality of antennas 811, 812, . . . 81n through an RF switch (not shown). The controller 850 may control the antenna selection. The antennas 811, 812, . . . 81n transmit RF signals.

An example in which the access point 800 receives signals will be described. The access point 800 may receive uplink signals from the user terminal 700. The uplink signals may be RF signals. In the access point 800, the plurality of antennas 811, 812, . . . 81n receive uplink signals. For processing, the receiver 820 may select signals received from one of the antennas 811, 812, . . . 81n. In some examples, signals from two or more selected from among the antennas 811, 812, . . . 81n may be combined. The receiver 820 generates a recovered uplink data symbol stream by performing processing corresponding to an operation performed by a transmitter of the user terminal. The receiver 820 provides the recovered uplink data symbol stream to an RX data processor 830. The RX data processor 830 processes (for example, demodulates, deinterleaves, or decodes) the recovered uplink data symbol stream to acquire decoded data for the access point 800. For data storage, the decoded data may be sent to a data sink 880. The RX data processor 830 may receive control data from the controller 850.

In one example, the receiver 820, the transmitter 820, or the transceiver 820 includes a voltage-controlled oscillator (VCO) 825. The oscillation frequency of the voltage-controlled oscillator is controlled by an input control voltage.

A number of examples have been described above. Nevertheless, it should be understood that various modifications may be made to these examples. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A voltage-controlled oscillator, comprising:
   a first transistor having a source coupled to a first power source, a drain coupled to a first node, and a gate coupled to a second node;
   a second transistor having a source coupled to the first power source, a drain coupled to the second node, and a gate coupled to the first node;
   an inductive impedance element having a first terminal coupled to the first node and a second terminal coupled to the second node;
   a first variable capacitive impedance element, having a first terminal coupled to the first node and a second terminal coupled to a third node, comprising a third transistor and a third resistor, wherein the third resistor is coupled between a gate of the third transistor and the third node, and a first capacitor coupled between the gate of the third transistor and a drain of the third transistor; and
   a second variable capacitive impedance element having a first terminal coupled to the second node and a second terminal coupled to the third node.

2. The voltage-controlled oscillator of claim 1, wherein a frequency control voltage is applied to the third node.

3. The voltage-controlled oscillator of claim 2, wherein the second variable capacitive impedance element comprises:
   a fourth transistor; and
   a third capacitor coupled between a gate of the fourth transistor and a drain of the fourth transistor.

4. The voltage-controlled oscillator of claim 3, wherein the first variable capacitive impedance element further comprises a second capacitor coupled between the gate of the third transistor and the first node, and the second variable capacitive impedance element further comprises a fourth capacitor coupled between the gate of the fourth transistor and the second node.

5. The voltage-controlled oscillator of claim 4, wherein the second capacitor, the first capacitor, the fourth capacitor, and the third capacitor are formed using interwire capacitance.

6. The voltage-controlled oscillator of claim 3, wherein the second variable capacitive impedance element further comprises a fourth resistor coupled between the gate of the fourth transistor and the third node.

7. The voltage-controlled oscillator of claim 3, wherein the source of the third transistor and a source of the fourth transistor are coupled to a second power source.

8. The voltage-controlled oscillator of claim 3, wherein the third transistor and the fourth transistor are metal-oxide-semiconductor (MOS) transistors.

9. The voltage-controlled oscillator of claim 3, further comprising:
a first bias circuit configured to provide a bias current to the drain of the third transistor; and
a second bias circuit configured to provide the bias current to the drain of the fourth transistor.

10. The voltage-controlled oscillator of claim 9, wherein the first bias circuit comprises:
a fifth transistor having a gate and a drain coupled together, and a bias voltage applied to a source of the fifth transistor; and
a sixth transistor having a gate coupled to the gate of the fifth transistor, a drain coupled to the drain of the third transistor, and the bias voltage applied to the source of the sixth transistor, and
the second bias circuit comprises:
a seventh transistor having a gate and a drain coupled together, and the bias voltage applied to a source of the seventh transistor; and
an eighth transistor having a gate coupled to the gate of the seventh transistor, a drain coupled to the drain of the fourth transistor, and the bias voltage applied to a source of the eighth transistor.

11. The voltage-controlled oscillator of claim 10, wherein the first bias circuit further comprises a first mirror resistor coupled between the drain of the fifth transistor and a second power source, and
the second bias circuit further comprises a second mirror resistor coupled between the drain of the seventh transistor and the second power source.

12. The voltage-controlled oscillator of claim 1, wherein a common connection terminal of the inductive impedance element is coupled to a second power source.

13. The voltage-controlled oscillator of claim 1, further comprising:
a first resistor coupled between the drain of the first transistor and the first node; and
a second resistor coupled between the drain of the second transistor and the second node.

14. A wireless communication device, comprising:
at least one antenna; and
at least one of a receiver configured to receive a radio frequency (RF) signal through the at least one antenna or a transmitter configured to transmit an RF signal through the at least one antenna,
wherein at least one of the receiver or the transmitter comprises the voltage-controlled oscillator of claim 1.

15. An electronic device comprising the voltage-controlled oscillator of claim 1.

16. A voltage-controlled oscillator, comprising:
cross-coupled transistors; and
capacitive impedance elements respectively coupled between the cross-coupled transistors and a frequency control voltage,
wherein the capacitive impedance elements each comprise:
a transistor;
a capacitor coupled between a gate and a drain of the transistor; and
a resistor coupled between the gate of the transistor and the frequency control voltage.

17. The voltage-controlled oscillator of claim 16, wherein the capacitive impedance elements each further comprise an additional capacitor coupled between each of the cross-coupled transistors and the gate of the transistor.

18. The voltage-controlled oscillator of claim 16, wherein the capacitive impedance elements each further comprise a bias circuit configured to provide a bias current to the transistor included in each of the capacitive impedance elements.

19. The voltage-controlled oscillator of claim 18, wherein the bias circuit is further configured to provide the bias current to the drain of the transistor included in each of the capacitive impedance elements.

* * * * *